United States Patent
Lin et al.

(10) Patent No.: US 7,754,544 B2
(45) Date of Patent: Jul. 13, 2010

(54) DYNAMIC RANDOM ACCESS MEMORY CELL AND MANUFACTURING METHOD THEREOF

(75) Inventors: Ta-Wei Lin, Chiayi County (TW); Wen-Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/570,147

(22) Filed: Sep. 30, 2009

(65) Prior Publication Data

US 2010/0035389 A1 Feb. 11, 2010

Related U.S. Application Data

(62) Division of application No. 11/619,663, filed on Jan. 4, 2007, now abandoned.

(51) Int. Cl.
*H01L 21/8242* (2006.01)

(52) U.S. Cl. .................. 438/151; 438/163; 438/164; 257/656; 257/E21.425; 257/E21.426; 257/E21.431

(58) Field of Classification Search ................ 438/151, 438/163, 164; 257/66
See application file for complete search history.

(56) References Cited

U.S. PATENT DOCUMENTS

| 5,622,880 | A | 4/1997 | Burr et al. |
|---|---|---|---|
| 6,429,056 | B1 | 8/2002 | Bryant et al. |
| 6,770,517 | B2 | 8/2004 | Nakaoka et al. |
| 2006/0076619 | A1 | 4/2006 | Wang et al. |
| 2007/0001162 | A1* | 1/2007 | Orlowski et al. ............ 257/19 |
| 2007/0117334 | A1* | 5/2007 | Nayfeh et al. ............ 438/301 |
| 2007/0161169 | A1* | 7/2007 | Belyansky et al. .......... 438/197 |
| 2007/0202637 | A1* | 8/2007 | Mandelman et al. ........ 438/149 |

* cited by examiner

*Primary Examiner*—Ahmed Sefer
(74) *Attorney, Agent, or Firm*—Thomas, Kayden, Horstemeyer & Risley

(57) ABSTRACT

A dynamic random access memory cell and a manufacturing method thereof are provided. First, a substrate on which a bottom oxide layer and a semiconductor layer are formed is provided. The semiconductor layer is formed on the bottom oxide layer. Next, a gate is formed on the semiconductor layer. Then, the semiconductor layer is patterned to expose a portion of the bottom oxide layer. Afterwards, an insulation layer is formed at the side walls of the semiconductor layer, wherein the height of the insulation layer is shorter than that of the semiconductor layer, so that a gap is formed between the tops of the insulation layer and the semiconductor layer. Further, a doping layer covering the insulation layer and having the same height with the semiconductor layer is formed on the bottom oxide layer. The doping layer contacts the side walls of the semiconductor layer via the gap.

18 Claims, 8 Drawing Sheets

DYNAMIC RANDOM ACCESS MEMORY CELL AND MANUFACTURING METHOD THEREOF

This application is a divisional application of co-pending application Ser. No. 11/619,663, filed on Jan. 4, 2007, the subject matter of which is incorporated herein by reference.

BACKGROUND OF THE INVENTION

1. Field of the Invention

The invention relates in general to a memory cell and a manufacturing method thereof, and more particularly to a single transistor dynamic random access memory cell and a manufacturing method thereof.

2. Description of the Related Art

Dynamic random access memory (DRAM) has now been widely used in personal computers and various peripheral electronic products or devices including graphic cards, scanners, printers, facsimile machines, and image compressing cards. Recently, in addition to the conventional dynamic random access memory (1T1C-DRAM) composed of transistors and capacitors, a single transistor dynamic random access memory (1T-DRAM) without using any capacitor is further developed. A bit of data is stored when the floating body is carrying charges. With the simplification in the structure of the memory, the storage density per unit area is increased, and the manufacturing process is simplified. As the 1T-DRAM adopts a non-destructive way of reading, the lifespan of the memory is prolonged. Thus, the 1T-DRAM, having great potential, has become an important direction for developing memory devices.

Generally, the 1T-DRAM isolates the floating body among the source area, the drain area, the bottom oxide and the gate oxide by forming a cell on a silicon-on-insulator (SOI) wafer, so that electric charges can be stored. However, along with the advance in the manufacturing process of memory, the dimensions of memory elements are gradually reduced, and the length of the channel between the source area and the drain area of a cell is reduced accordingly. When the length of the channel is reduced to a certain level, short channel effect such as threshold voltage drop, punch through effect or drain induced barrier lowering (DIBL) will occur, affecting the stability in the operation of the memory.

SUMMARY OF THE INVENTION

The invention is directed to a dynamic random access memory cell and a manufacturing method thereof. By forming an insulation layer between the semiconductor layer and the doping layer, the junction area between the semiconductor layer and the doping layer is reduced, so that the dynamic random access memory cell has the advantages of reducing charge leakage, avoiding short channel effect and prolonging data retention.

According to one aspect of the present invention, a manufacturing method of a dynamic random access memory cell is provided. First, a substrate on which a bottom oxide layer and a semiconductor layer are formed is provided. The semiconductor layer is formed on the bottom oxide layer. Next, a gate is formed on the semiconductor layer. Then, the semiconductor layer is patterned to expose a portion of the bottom oxide layer. Afterwards, an insulation layer is formed at the side walls of the semiconductor layer, wherein the height of the insulation layer is shorter than the side walls of the semiconductor layer, so that a gap is formed between the tops of the insulation layer and the semiconductor layer. Further, a doping layer covering the insulation layer and having the same height with the semiconductor layer is formed on the bottom oxide layer. The doping layer contacts the side walls of the semiconductor layer via the gap.

According to another aspect of the present invention, a dynamic random access memory cell including a bottom oxide layer, a semiconductor layer, an insulation layer, a doping layer and a gate is provided. The bottom oxide is disposed on the substrate. The semiconductor layer is disposed on the bottom oxide layer, and only covers a portion of the bottom oxide layer. The insulation layer is disposed at the side walls of the semiconductor layer. The height of the insulation layer is different from that of the semiconductor layer, so that a gap is formed between the tops of the semiconductor layer and the insulation layer. The doping layer is disposed on the bottom oxide layer and has the same height with the semiconductor layer. The doping layer contacts the side walls of the semiconductor layer via the gap. The gate is disposed on the semiconductor layer.

The invention will become apparent from the following detailed description of the preferred but non-limiting embodiments. The following description is made with reference to the accompanying drawings.

DETAILED DESCRIPTION OF THE INVENTION

The invention is elaborated by two embodiments disclosed below. The difference between the two embodiments lies in the material for the insulation layer and the way of formation of the insulation layer. However, the two embodiments are used for elaborating purpose not for limiting the scope of protection of the invention. The two embodiments are still within the scope of protection as defined in the appended claims. In order to illustrate the technical features of the invention, unnecessary elements are omitted in the related drawings.

First Embodiment

Figure 1:
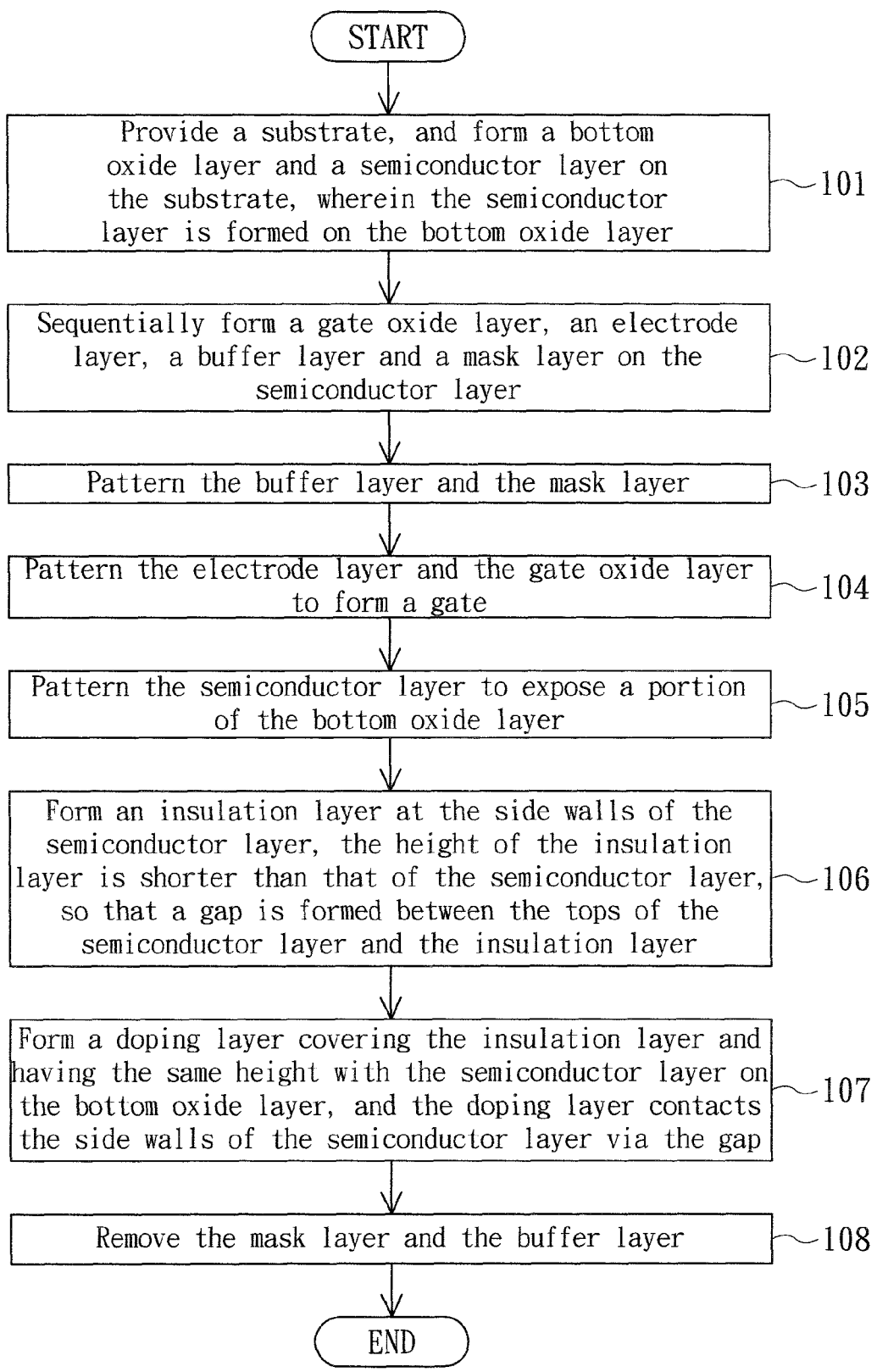
FIG. 1 is a flowchart of a method for manufacturing a dynamic random access memory cell according to a first embodiment of the invention.
Figure 2A:
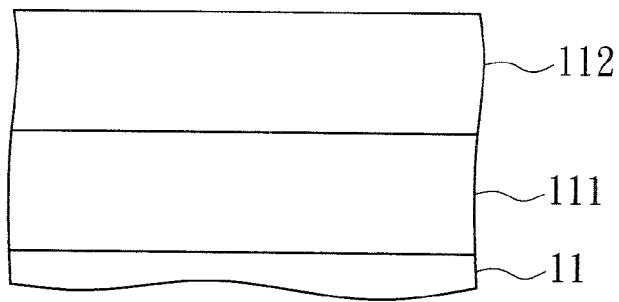
FIGS. 2A~2E are respective perspectives of steps 101~105 in FIG. 1.
Figure 2B:
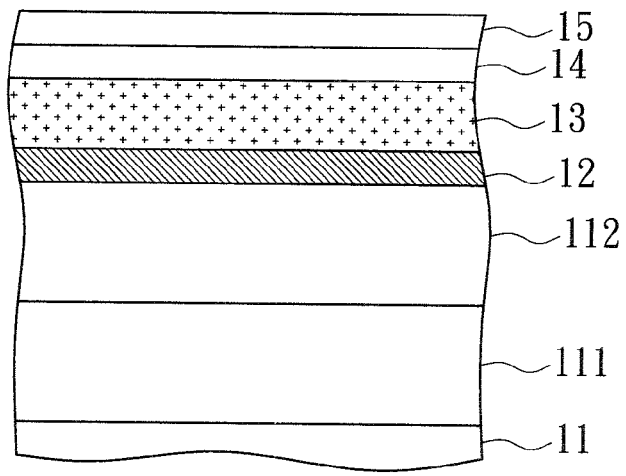
Figure 2C:
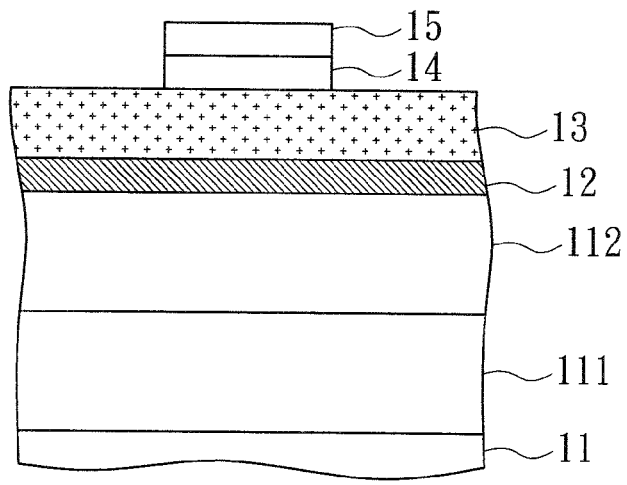
Figure 2D:
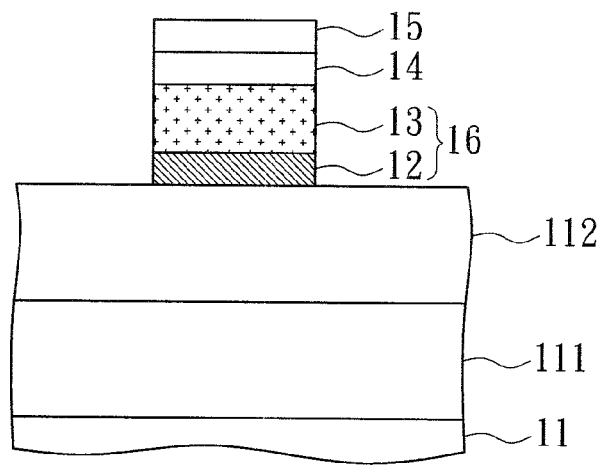
Figure 2E:
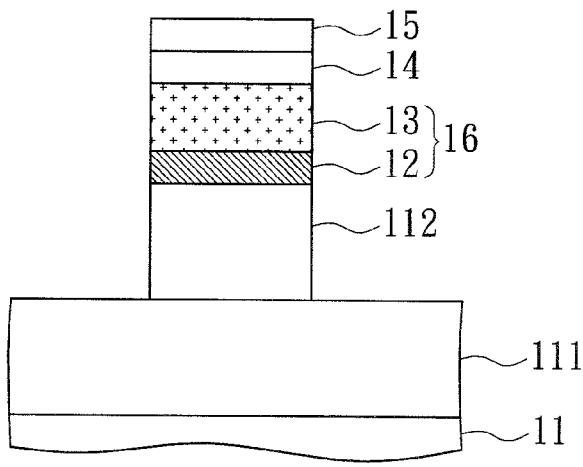
Figure 2F:
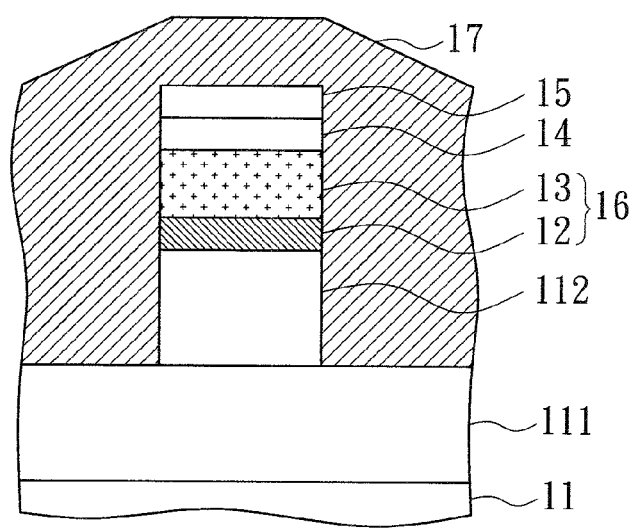
FIG. 2F~2G are perspectives of step 106 in FIG. 1.
Figure 2G:
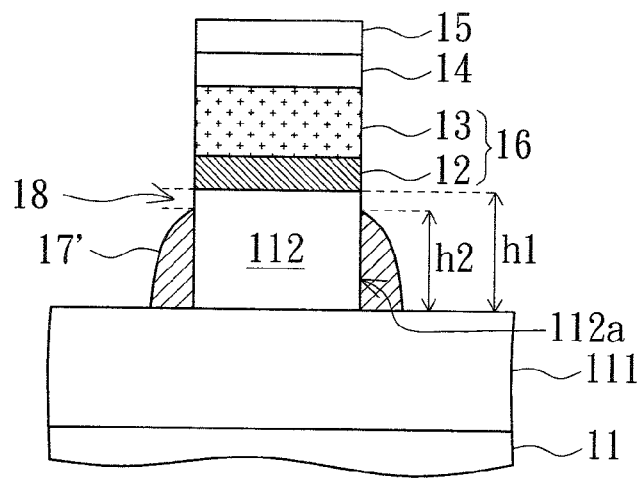
Figure 2H:
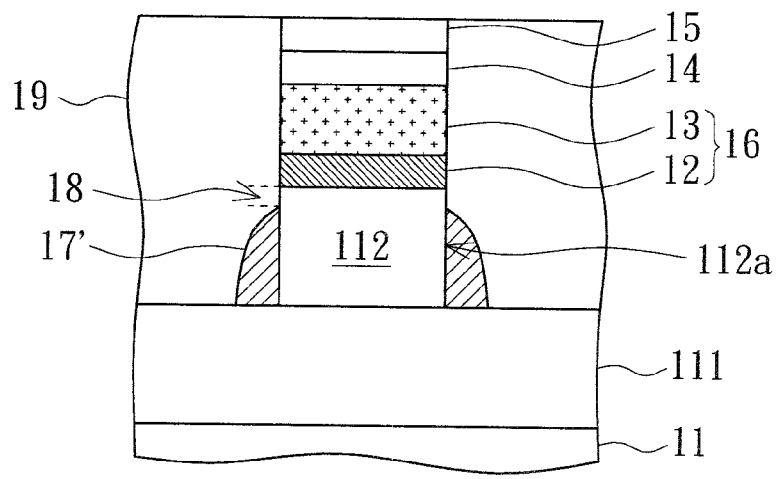
FIGS. 2H~2I are perspectives of step 107 in FIG. 1.
Figure 2I:
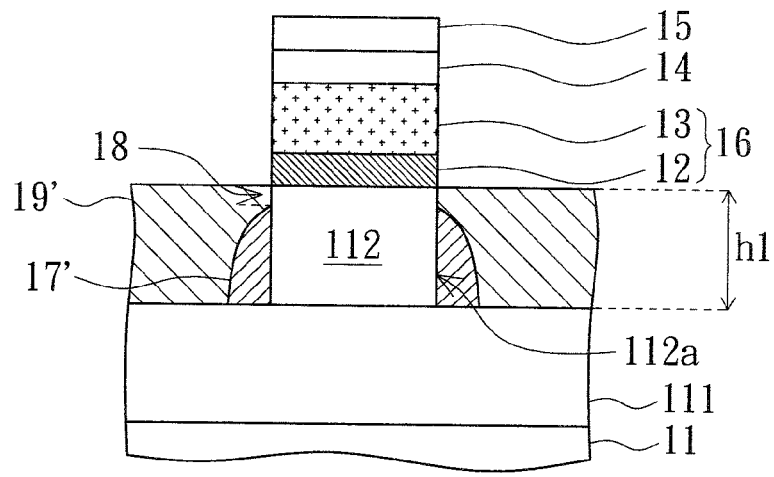
Figure 2J:
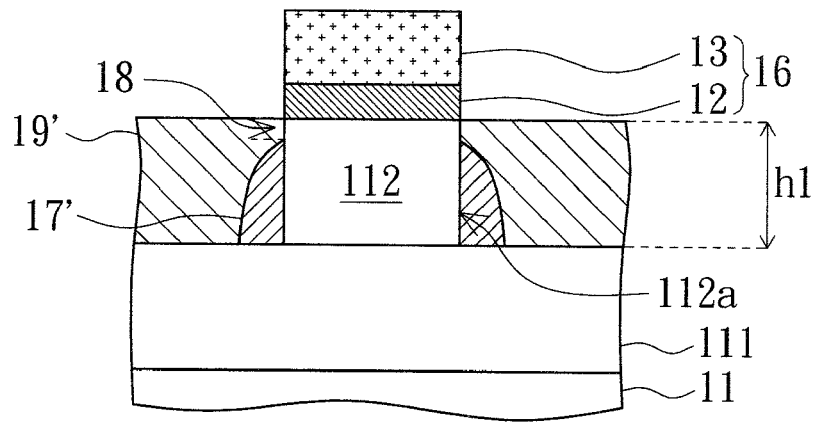
FIG. 2J is a perspective of step 108 in FIG. 1.

Referring to both FIG. 1 and FIGS. 2A~2J. FIG. 1 is a flowchart of a method for manufacturing a dynamic random access memory cell according to a first embodiment of the invention. FIGS. 2A~2E are respective perspectives of steps 101~105 in FIG. 1. FIGS. 2F~2G are perspectives of step 106 in FIG. 1. FIGS. 2H~2I are perspectives of step 107 in FIG. 1. FIG. 2J is a perspective of step 108 in FIG. 1.

The manufacturing method of the present embodiment of the invention begins at step 101 and FIG. 2A, a substrate 11 is provided, a bottom oxide layer 111 is formed on the substrate 11, and a semiconductor layer 112 is formed on the bottom oxide layer 111.

Next, as indicated in step 102 and FIG. 2B, a gate oxide layer 12, an electrode layer 13, a buffer layer 14 and a mask layer 15 are sequentially formed on the semiconductor layer 112, the gate oxide layer 12, the electrode layer 13 and the buffer layer 14.

Then, as indicated in step 103 and FIG. 2C, the buffer layer 14 and the mask layer 15 are patterned. In the present embodiment of the invention, the buffer layer 14 is preferably made from silicon dioxide ($SiO_2$). During the patterning process, the buffer layer 14 is used for enhancing the adherence of the mask layer 15 on the electrode layer 13.

After that, as indicated in step 104 and FIG. 2D, the electrode layer 13 and the gate oxide layer 12 are patterned so as to form a gate 16. In the present embodiment of the invention, the mask layer 15 is preferably made from silicon nitride ($Si_3N_4$) for protecting the non-etching part on the electrode layer 13 and the gate oxide layer 12. After steps 102~104 are performed according to the present embodiment of the invention, the gate 16 is formed on the semiconductor layer 112.

Afterwards, as indicated in step 105 and FIG. 2E, the semiconductor layer 112 is patterned according to the pattern used for patterning the buffer layer 14 and mask layer 15 to expose a portion of the bottom oxide layer 111.

Next, the method proceeds to step 106, an insulation layer is formed at the side walls of the semiconductor layer. In the present embodiment of the invention, the method of forming the insulation layer begins at forming an oxide layer 17 on the bottom oxide layer 111 by way of plasma assisted chemical vapor deposition, wherein the oxide layer 17 covers the bottom oxide layer 111, the semiconductor layer 112, the gate 16, the buffer layer 14 and the mask layer 15 as indicated in FIG. 2F. Next, the oxide layer 17 is etched, wherein the etched oxide layer 17 becomes an insulation layer 17'. As indicated in FIG. 2G, the insulation layer 17' is formed at the side walls 112a of the semiconductor layer 112, wherein the height h2 of the insulation layer is shorter than the height h1 of the semiconductor layer 112, so that a gap 18 is formed between the tops of the semiconductor layer 112 and the insulation layer 17.

Next, the method proceeds to step 107, a doping layer is formed on the bottom oxide layer 111. The formation of the doping layer can be achieved by, for example, depositing a silicon layer 19 on the bottom oxide layer 111 first. After a planarizing process, the silicon layer 19 is situated at the two sides of the semiconductor layer 112, the gate 16, the buffer layer 14 and the mask layer 15, and covers the insulation layer 17' as indicated FIG. 2H. At this moment, the silicon layer 19 has the same height with the mask layer 15. Next, the silicon layer 19 is etched, and a dopant is doped into the etched silicon layer by way of ion implantation. The etched and doped silicon layer becomes a doping layer 19'. As indicated in FIG. 2I, the doping layer 19', having the same height h1 with the semiconductor layer 112, contacts the side walls 112a of the semiconductor layer 112 via the gap 18.

Afterwards, as indicated in step 108, the mask layer 15 and the buffer layer 14 are removed. The structure composed of the bottom oxide layer 111, the semiconductor layer 112, the gate 16, the insulation layer 17'and the doping layer 19' manufactured according to the steps 101~108 as indicated in FIG. 2J is the dynamic random access memory cell 100 according to the first embodiment of the invention. The doping layer 19' is the source and the drain of the cell 100. In the present embodiment of the invention, the width of the gap 18 is about 5 nm at most. The doping layer 19' forms a channel of the cell 100 by contacting the side walls 112a of the semiconductor layer 112 via the gap 18.

Moreover, the electrode layer 13 is made from N-type doped poly-silicon, the doping layer 19' is made from N-type dopant, and the cell 100 is an N-channel metal oxide semiconductor (NMOS) structure. However, anyone who is skilled in the related field of the invention will understand that the technology of the invention is not limited thereto. The electrode layer 13 can be made from P-type doped poly-silicon, the doping layer 19' can be made from P-type dopant, and the cell 100 can be a P-channel metal oxide semiconductor structure.

According to the dynamic random access memory cell and the manufacturing method thereof disclosed in the first embodiment of the invention, an insulation layer 17' is formed between the semiconductor layer 112 and the doping layer 19' for enabling the doping layer 19' to contact the semiconductor layer 112 via the gap 18 only, so that the junction area between the semiconductor layer 112 and the doping layer 19' is largely reduced. As a result, charge leakage is decreased, and data retention is prolonged.

Second Embodiment

The dynamic random access memory cell and manufacturing method thereof of the present embodiment of the invention differs with that of the first embodiment in the material for the insulation layer and the formation of the insulation layer. In the present embodiment of the invention, the steps prior to the formation of the insulation layer, including the step of providing the substrate, the step of forming the gate oxide layer, the electrode layer, the buffer layer and the mask layer, the step of patterning the buffer layer and the mask layer, the step of pattering the electrode layer and the gate oxide layer and the step of patterning the semiconductor layer, are the same with that in the first embodiment of the invention as indicated in FIG. 1 and FIGS. 2A~2E, and are not repeated here.

Figure 3:
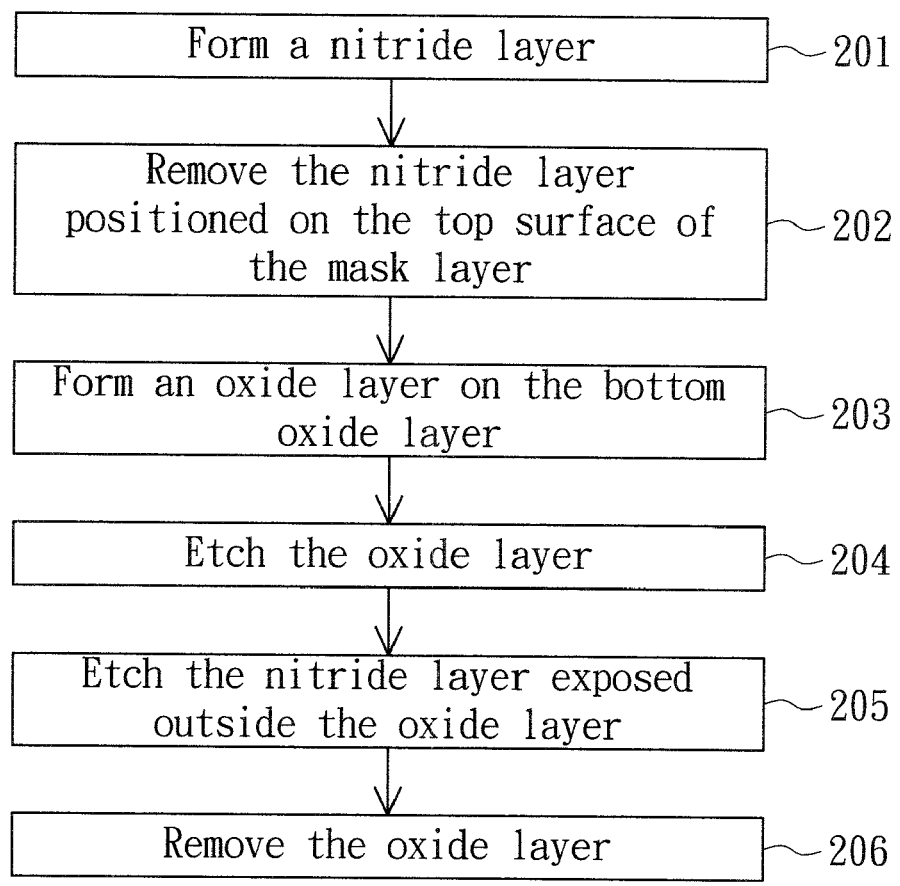
FIG. 3 is a flowchart of a method for forming an insulation layer according to a second embodiment of the invention.
Figure 4A:
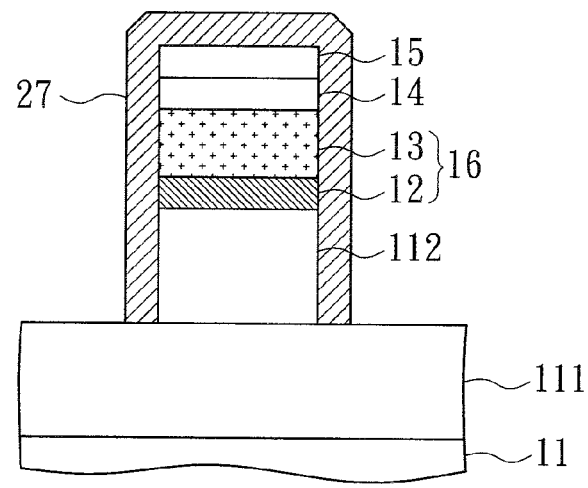
FIGS. 4A~4F are respective perspectives of steps 201~206 in FIG. 3.

Referring to both FIG. 3 and FIGS. 4A~4F. FIG. 3 is a flowchart of a method for forming an insulation layer according to a second embodiment of the invention. FIGS. 4A~4F are respective perspectives of steps 201~206 of FIG. 3. As indicated in step 201, the formation of the insulation layer according to the present embodiment of the invention is disclosed below. First, a nitride layer 27 is formed on the surface of the semiconductor layer 112, the gate 16, the buffer layer 14 and the mask layer 15 as indicated in FIG. 4A.

Figure 4B:
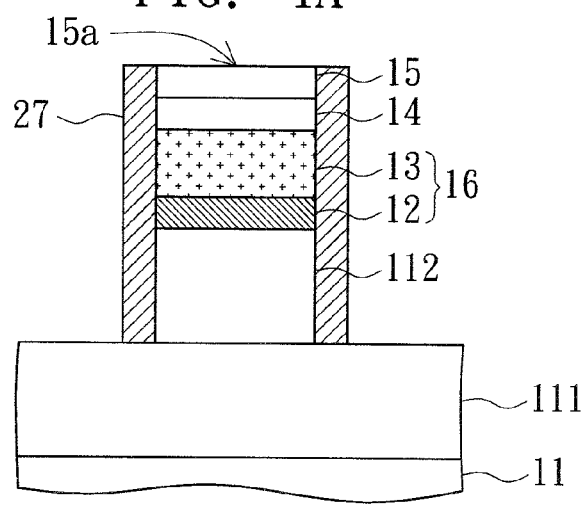

Then, as indicated in step 202 and FIG. 4B, a nitride layer 27 is planarized, wherein the nitride layer 27 at the top surface 15a of the mask layer 15 is removed by way of chemical mechanical polishing or etching back for example.

Figure 4C:
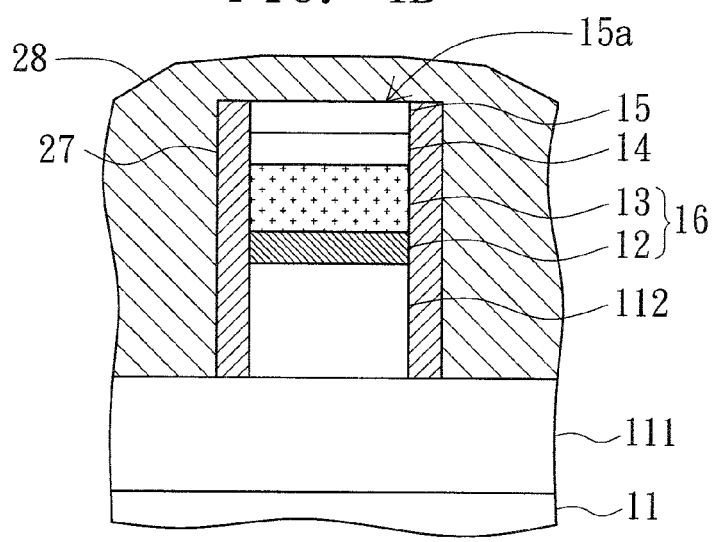

Further, as indicated in step 203 and FIG. 4C, an oxide layer 28 is formed on the bottom oxide layer 111 by way of plasma assisted chemical vapor deposition for example, wherein the oxide layer 28 covers the bottom oxide layer 111, the nitride layer 27 and the top surface 15a of the mask layer 15.

Figure 4D:
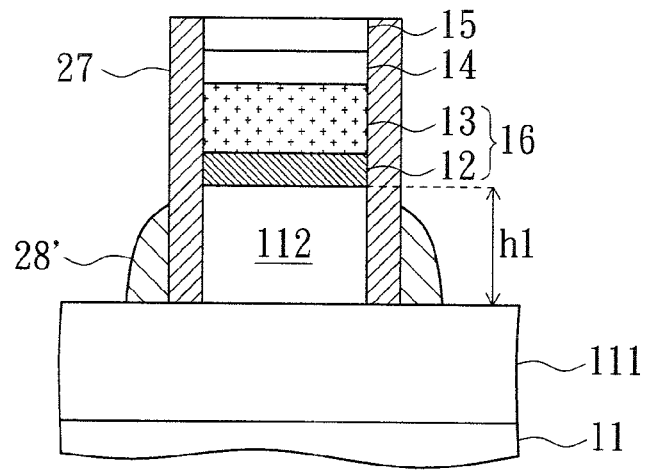

Next, the method proceeds to the etching step 204, the oxide layer 28 is etched so as to form the oxide layer 28'. As indicated in FIG. 4D, the oxide layer 28' exposes a portion of the nitride layer 27, and the height of the oxide layer 28' is slightly shorter than the height h1 of the semiconductor layer 112.

Figure 4E:
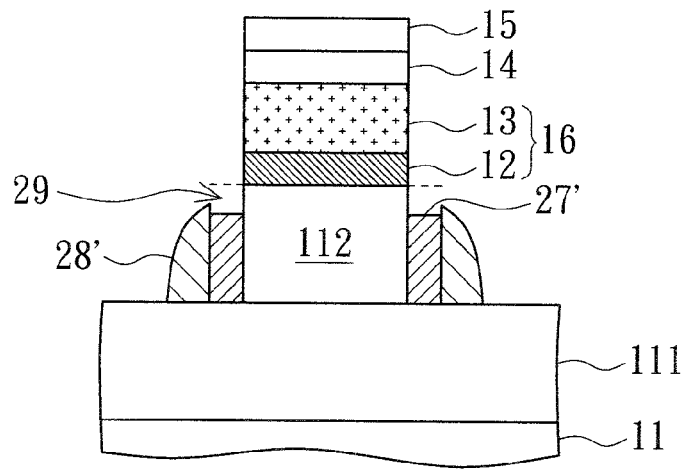

Then, as indicated in step 205 and FIG. 4E, the nitride layer 27 exposed outside the oxide layer 28' is etched, wherein the etched nitride layer 27 becomes an insulation layer 27'. As the insulation layer 27' is protected by the oxide layer 28', the height of the insulation layer 27' is slightly shorter than the height of the oxide layer 28', so that a gap 29 is formed between the top of the semiconductor layer 112 and the top of the insulation layer 27'.

Figure 4F:
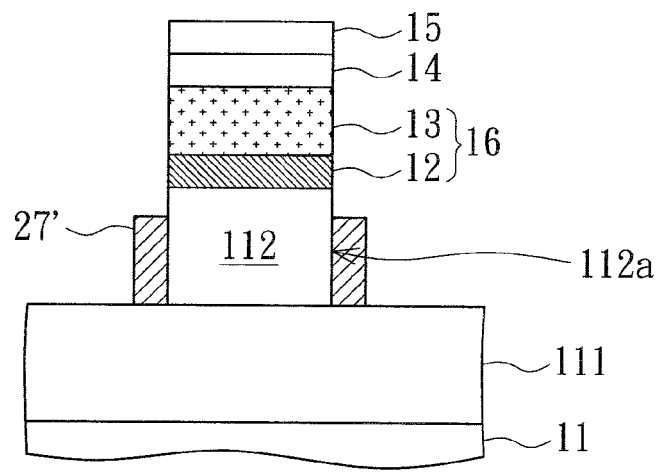

Afterwards, the method proceeds to step 206, the oxide layer 28' is removed. After steps 201~206 are performed, the insulation layer 27'is formed at the side walls 112a of the semiconductor layer 112 as indicated in FIG. 4F.

Figure 4G:
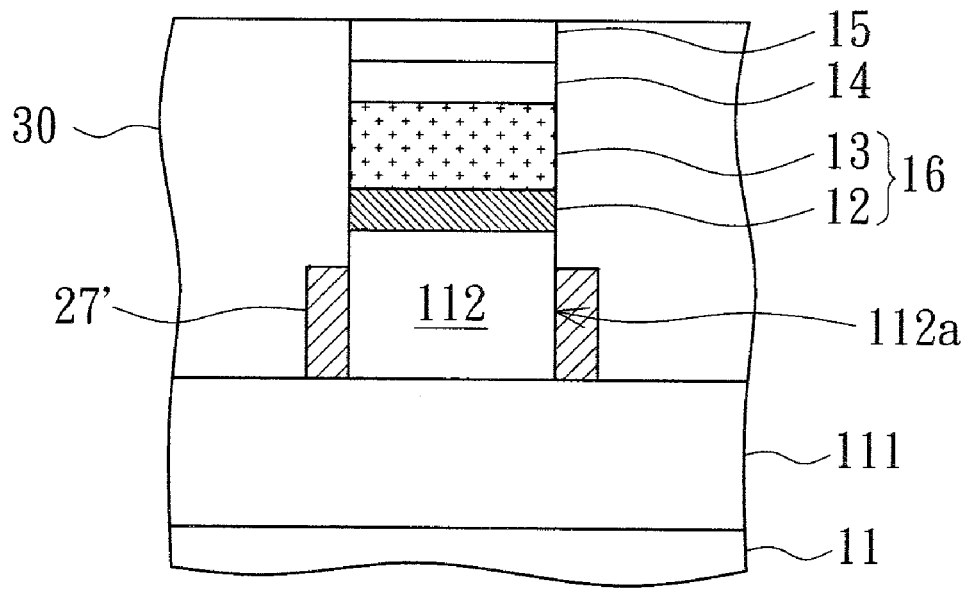
FIG. 4G is a perspective of a silicon layer being deposited and planarized on the bottom oxide layer after step 206 in FIG. 3 is completed.

After the formation of the insulation layer 27', the manufacturing method of the present embodiment of the invention further proceeds to the step of forming a doping layer. First, a silicon layer 30 is deposited and planarized on the bottom oxide layer 111 for example. Referring to FIG. 4G, a perspective of a silicon layer being deposited and planarized on the bottom oxide layer after step 206 of FIG. 3 is completed is shown. The silicon layer 30 is disposed at the two sides of the semiconductor layer 112, the gate 16, the buffer layer 14 and the mask layer 15, and covers the insulation layer 27'. Next, the silicon layer 30 is etched, and a dopant is further doped into the etched silicon layer by way of ion implantation, wherein the etched and doped silicon layer becomes a doping layer. Lastly, after the formation of the doping layer, the buffer layer 14 and the mask layer 15 are removed.

Figure 4H:
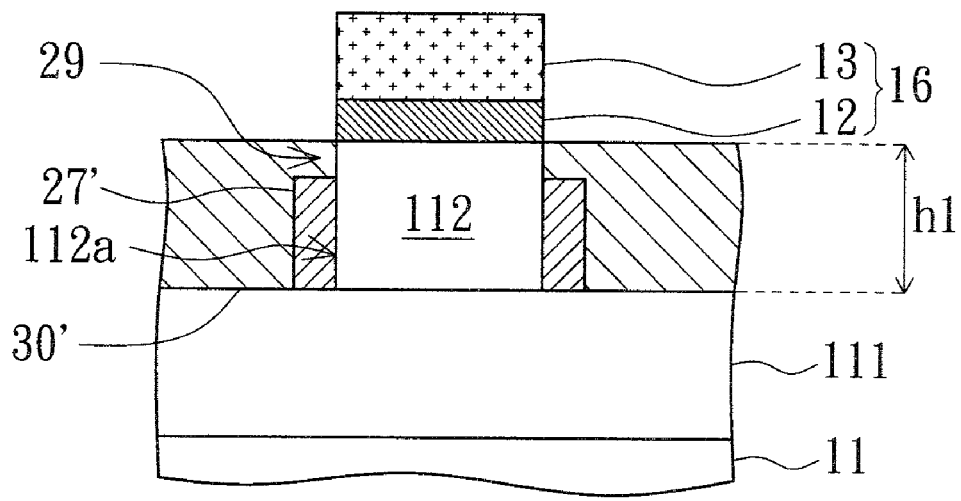
FIG. 4H is a perspective of a dynamic random access memory cell according to a second embodiment of the invention.

After the steps of forming the doping layer and removing the mask layer and the buffer layer, the dynamic random access memory cell according to the second embodiment of the invention is completed. Referring to FIG. 4H, a perspective of a dynamic random access memory cell according to a second embodiment of the invention is shown. The cell 200 includes a bottom oxide layer 111, a semiconductor layer 112, a gate 16, an insulation layer 27'and a doping layer 30'. The doping layer 30' is the source and the drain of the cell 200, and has the same height h1 with the semiconductor layer 112, so that the doping layer 30' contacts the side walls 112a of the semiconductor layer 112 via the gap 29 only so as to form a channel of the cell 200.

In the first and the second embodiments disclosed in the invention, the material for the insulation layer is respectively exemplified by an oxide and a nitride. However, anyone who is skilled in the related filed of the invention will understand that the technology of the invention is not limited thereto, and the insulation layer can be made from any dielectric material.

According to the dynamic random access memory cell and the manufacturing method thereof disclosed in the invention, the insulation layer is formed between the doping layer and the semiconductor layer, and the doping layer contacts the semiconductor layer via the gap only, so that the junction area between the semiconductor layer and the doping layer is decreased. In the dynamic random access memory cell and the manufacturing method thereof disclosed in the invention, as the doping layer contacts the semiconductor layer via the gap only, the junction area between the semiconductor layer and the doping layer is largely decreased, the leakage of charges through the junction is reduced, the regular operation of the memory cell is maintained, and data retention of cell is prolonged. Further, with the insulation layer being disposed between the semiconductor layer and the doping layer, short channel effects such as punch through effect are avoided, hence maintaining accuracy in the operation of the memory. Besides, as the manufacturing method according to the invention is compactable with conventional transistor manufacturing method, no significant change is added to the existing manufacturing process, hence dispensing the purchase of new equipment and saving manufacturing cost.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a dynamic random access memory cell, comprising:
   providing a substrate;
   forming a bottom oxide layer and a semiconductor layer on the substrate, wherein the semiconductor layer is formed on the bottom oxide layer;
   forming a gate on the semiconductor layer;
   patterning the semiconductor layer to expose a portion of the bottom oxide layer;
   forming an insulation layer at the side walls of the semiconductor layer, wherein the height of the insulation layer is shorter than the height of the side walls of the semiconductor layer, so that a gap is formed between the tops of the semiconductor layer and the insulation layer; and
   forming a silicone layer on the bottom oxide layer to cover the insulation layer and a surface of the bottom oxide layer exposed after forming the insulation layer and doping the silicone layer to form a doping layer on the bottom oxide layer, wherein the doping layer has the same height with the semiconductor layer, and the doping layer contacts the side walls of the semiconductor layer via the gap.

2. The manufacturing method according to claim 1, wherein the step of forming the gate comprises:
   forming a gate oxide layer on the semiconductor layer;
   forming an electrode layer on the gate oxide layer;
   forming a buffer layer on the electrode layer;
   forming a mask layer on the buffer layer;
   patterning the buffer layer and the mask layer; and
   patterning the electrode layer and the gate oxide layer so as to form the gate.

3. The manufacturing method according to claim 2, wherein the electrode layer is made from N-type doped polysilicon.

4. The manufacturing method according to claim 3, wherein the cell is an N-channel metal oxide semiconductor (NMOS) structure.

5. The manufacturing method according to claim 2, wherein the electrode layer is made from P-type doped polysilicon.

6. The manufacturing method according to claim 5, wherein the cell is a P-channel metal oxide semiconductor structure.

7. The manufacturing method according to claim 2, wherein the buffer layer is made from silicon dioxide ($SiO_2$).

8. The manufacturing method according to claim 2, wherein the mask layer is made from silicon nitride ($Si_3N_4$).

9. The manufacturing method according to claim 2, wherein after the step of forming the doping layer, the method further comprises:
   removing the mask layer and the buffer layer.

10. The manufacturing method according to claim 1, wherein the step of forming the insulation layer comprises:
    forming an oxide layer on the bottom oxide layer, wherein the oxide layer covers the bottom oxide layer, the semiconductor layer and the gate; and etching the oxide layer for forming the gap between the tops of the semiconductor layer and the oxide layer, wherein the etched oxide layer is the insulation layer.

11. The manufacturing method according to claim 10, wherein the oxide layer is formed on the bottom oxide layer by way of plasma assisted chemical vapor deposition (PACVD).

12. The manufacturing method according to claim 1, wherein the step of forming the insulation layer comprises:
   forming a nitride layer on the surface of the bottom oxide layer, the semiconductor layer and the gate;
   removing the nitride layer positioned on the top surface of the gate;
   forming an oxide layer on the bottom oxide layer, wherein the oxide layer covers the bottom oxide layer, the nitride layer and the top surface of the gate;
   etching the oxide layer for exposing a portion of the nitride layer, wherein the height of the oxide layer is slightly shorter than the height of the semiconductor layer;
   etching the nitride layer exposed outside the oxide layer for forming the gap between the tops of the semiconductor layer and the nitride layer, wherein the etched nitride layer is the insulation layer; and
   removing the oxide layer.

13. The manufacturing method according to claim 12, wherein the oxide layer is formed on the bottom oxide layer by way of plasma assisted chemical vapor deposition.

14. The manufacturing method according to claim 12, wherein the nitride layer positioned on the top surface of the mask layer is removed by way of chemical mechanical polishing (CMP) or etching back process.

15. The manufacturing method according to claim 1, wherein the step of forming the silicon layer comprises:
   forming an original silicon layer on the bottom oxide layer, wherein the original silicon layer is disposed at the two sides of the semiconductor layer and the gate and covers the insulation layer, and the original silicon layer contacts the side walls of the semiconductor layer via the gap; and
   etching the original silicon layer to form the silicon layer.

16. The manufacturing method according to claim 1, wherein the silicon layer is formed on the bottom oxide layer by way of chemical vapor deposition.

17. The manufacturing method according to claim 1, wherein the silicon layer is doped by ion implantation.

18. The manufacturing method according to claim 1, wherein the gap is 5 nm at most.

* * * * *